United States Patent [19]

Lee et al.

[11] Patent Number: 4,625,127

[45] Date of Patent: Nov. 25, 1986

[54] HIGH-FANOUT CLOCK DRIVER FOR LOW LEVEL GATES

[75] Inventors: Gil S. Lee, San Jose; Ashok Kumar, Saratoga, both of Calif.

[73] Assignee: Advanced Micro Devices, Inc., Sunnyvale, Calif.

[21] Appl. No.: 638,094

[22] Filed: Aug. 6, 1984

[51] Int. Cl.$^4$ .................... H03K 19/20; H03K 17/12; H03K 19/088

[52] U.S. Cl. .................... 307/270; 307/445; 307/465; 307/456

[58] Field of Search ............. 307/443, 445, 270, 456, 307/458, 465, 466, 480

[56] References Cited

U.S. PATENT DOCUMENTS

| | | | |
|---|---|---|---|
| 3,145,309 | 8/1964 | Bothwell et al. | 307/466 |
| 3,287,719 | 11/1966 | Thornberg et al. | 307/445 X |
| 3,538,443 | 11/1970 | Tague | 307/445 |
| 3,579,119 | 5/1971 | Yau | 307/465 |
| 4,337,465 | 6/1982 | Spracklen et al. | 307/270 X |
| 4,477,738 | 10/1984 | Kouba | 307/445 |
| 4,564,773 | 1/1986 | Tanizawa et al. | 307/445 |

Primary Examiner—Stanley D. Miller
Assistant Examiner—David R. Bertelson
Attorney, Agent, or Firm—Patrick T. King; Davis Chin; J. Vincent Tortolano

[57] ABSTRACT

A clock driver circuit for low level gates having high fanout capabilities includes a first circuit portion, a second circuit portion, an output transistor and a load resistor. The first circuit portion is formed of a first NAND logic gate and a first inverter gate. The input node of the first inverter circuit gate is coupled to the output node of the first NAND gate. The input node of the first NAND gate is connected to an input circuit terminal. The second circuit portion is formed of a second NAND logic gate, a third NAND logic gate and a second inverter gate. The input nodes of the second and third NAND gates are coupled together and to the input circuit terminal. The output node of the second and third NAND gates are coupled together and to the input node of the second inverter gate. The output node of the second inverter gate is connected to an output circuit terminal. The output transistor has its base coupled to the output node of the first inverter gate, its collector coupled to a voltage supply potential and its emitter coupled to the output circuit terminal. The load resistor has its one end connected to the base of the output transistor and its other end connected to the voltage supply potential.

20 Claims, 6 Drawing Figures

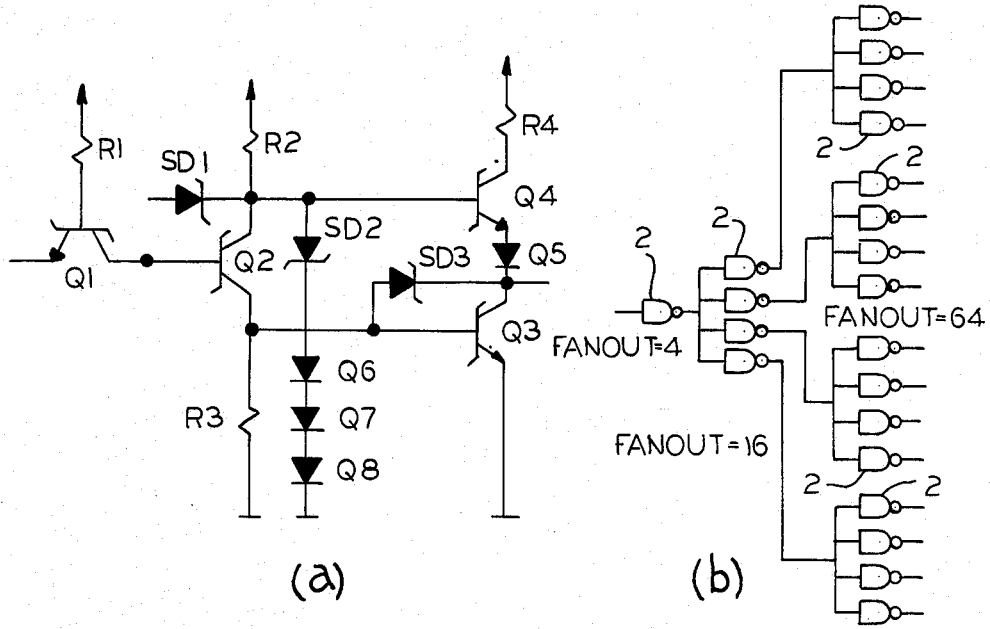
FIG. 1
(PRIOR ART)
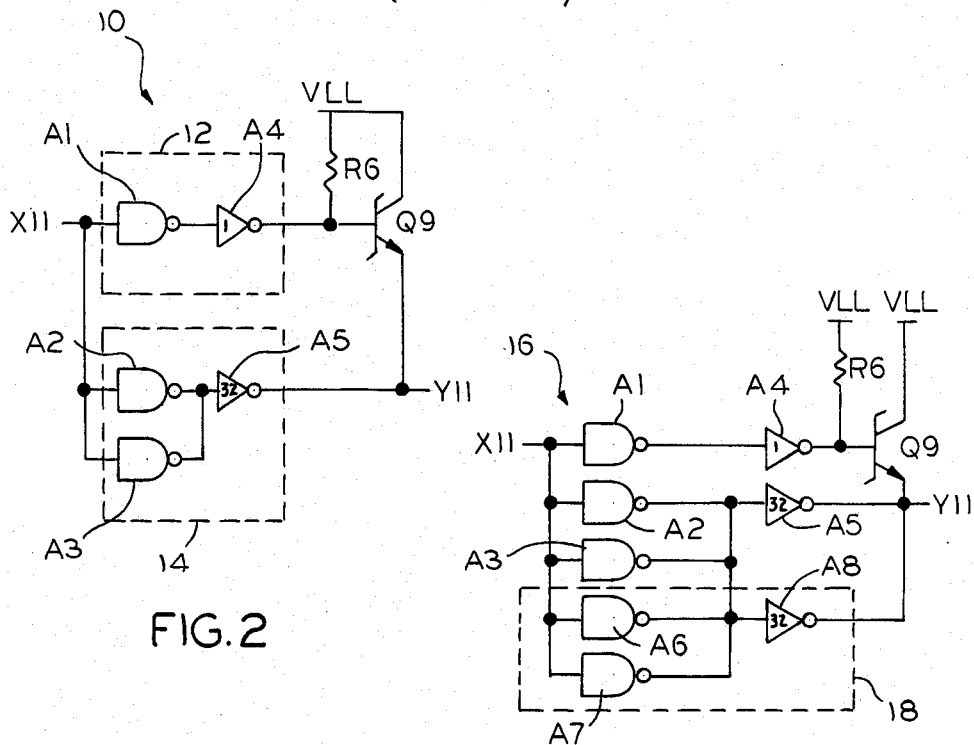
FIG. 2
FIG. 4

HIGH-FANOUT CLOCK DRIVER FOR LOW LEVEL GATES

BACKGROUND OF THE INVENTION

1. Field of the Invention

The present invention relates generally to logic circuitry and more particularly, it relates to a clock driver circuit for low level gates which provide high fanout capabilities and consumes less electrical power.

2. DESCRIPTION OF THE PRIOR ART

Heretofore, circuitry in the prior art for producing a high fanout were implemented by TTL (Transistor-Transistor Logic) drivers which required a higher supply voltage (typically about 5 volts) than were required by lower level gates. These prior art drivers suffered from the disadvantages of increased power consumption and complex design layout due to the necessity of an extra supply voltage line. In an effort to overcome these disadvantages, there has been attempted in the prior art the method of cascading gates in multiple stages so as to increase fanout. However, this technique is not without defects since there is required an increased number of gates for obtaining a high fanout, thereby resulting in a higher power consumption, additional wiring connections and clock skew.

A conventional TTL driver circuit of the prior art is shown in FIG. 1(a) which has been labeled "Prior Art". In order to provide a high number of fanouts such as 64, there is required many NAND gates which are cascaded in many stages as is depicted in FIG. 1(b). Each of the NAND gates 2 is constructed in accordance to the driver circuit of FIG. 1(a). Thus, it can be seen that there are required a total of 21 NAND gates cascaded in the form of three stages so as to achieve a fanout of 64. It should be readily apparent that this driver circuit arrangement of FIG. 1(b) uses a high number of gate components for its construction causing use of more space area and increased manufacturing costs.

It would therefore be desirable to provide a clock driver circuit which has high fanout capabilities and lower power consumption, but yet is realized by using a reduced number of gate components. Further, the complexity of the driver circuit of the present invention has been reduced so as to facilitate the ease of manufacturing and assembly.

SUMMARY OF THE INVENTION

It is a general object of the present invention to provide a clock driver circuit for low level gates which is capable of operating with high fanout, consuming less electrical power, and exhibiting a relatively simplified circuit construction.

It is another object of the present invention to provide a clock driver circuit which has a reduced number of gates and requires only a low level gate compatible supply voltage.

It is another object of the present invention to provide a clock driver circuit for low level gates which includes a first circuit portion consisting of a first NAND logic gate and a first inverter gate, a second circuit portion consisting of a second NAND logic gate, a third NAND logic gate and a second inverter gate, an output transistor, and a load resistor.

It is still another object of the present invention to provide a clock driver circuit for low level gates which includes a first circuit portion formed of a first NAND logic gate and a first inverter gate, a plurality of second circuit portions each consisting of a second NAND logic gate, a third NAND logic gate and a second inverter gate, an output transistor, and a load resistor.

In accordance with these aims and objectives, the instant invention is concerned with the provision of a clock driver circuit for low level gates which provide high fanout capabilities and includes a first circuit portion, a second circuit portion, an output transistor and a load resistor. The first circuit portion is formed of a first NAND logic gate and a first inverter gate. The input node of the first inverter gate is coupled to the output node of the first NAND gate. The input node of the first NAND gate is connected to an input circuit terminal. The second circuit portion is formed of a second NAND logic gate, a third NAND logic gate and a second inverter gate. The input nodes of the second and third logic gates are coupled together and to the input circuit terminal. The output nodes of the second and third logic gates are coupled together and to the input node of the second inverter gate. The output node of the second inverter gate is connected to an output circuit terminal. An output transistor is provided which has its base coupled to the output node of the first inverter gate, its collector coupled to a voltage supply potential, and its emitter coupled to the output circuit terminal. A load resistor has its one end connected to the base of the output transistor and its other end connected to the voltage supply potential.

In another aspect of the present invention, there is provided a clock driver circuit for low level gates which include a first circuit portion, a plurality of second circuit portions, an output transistor and a load resistor. The first circuit portion is formed of a first NAND logic gate and a first inverter gate. Each of the plurality of second circuit portions is formed of a second NAND logic gate, a third NAND gate and a second inverter gate.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein:

FIG. 1(a) is a schematic circuit diagram of a TTL driver according to the prior art;

FIG. 1(b) is a diagram of a cascaded gate arrangement for producing high fanout according to the prior art;

FIG. 2 is a schematic circuit diagram of a clock driver circuit according to the present invention;

FIGS. 4, 5 and 6 illustrate other embodiments of the present invention which accommodate increased fanout requirements.

DESCRIPTION OF THE PREFERRED EMBODIMENTS

Referring now in detail to the various views of the drawings, there is shown in FIG. 2 a clock driver circuit 10 of the present invention which is capable of high fanout in that it can drive 40 units of low level gates. The clock driver circuit 10 has an input circuit terminal designated at X11 and an output circuit terminal designated as Y11. The clock driver circuit is comprised of three input low level NAND logic gates which are designated as A1, A2 and A3, respectively, and two low level inverter gates which are referred to as A4 and A5, respectively. The clock driver circuit 10 further includes a load resistor R6 and an output Schottky transistor Q9. The Schottky transistor is conventional in its construction and is well known to those skilled in the art.

As can be seen, a first circuit portion 12 is formed by the NAND logic gate A1 and the inverter gate A4 whose input is coupled to the output of the gate A1. The input of the NAND gate A1 is coupled to the input terminal X11. The output of the inverter gate A4 is connected to one end of the load resistor R6 and to the base of the Schottky transistor Q9. The other end of the load resistor R6 is connected to a voltage supply potential VLL, which is coupled to the collector of the Schottky transistor Q9. The emitter of the transistor Q9 is tied to the output circuit terminal Y11. The voltage supply potential VLL may be any supply voltage between 2.0 volts and 2.5 volts which is compatible with low level gates.

A second circuit portion 14 is formed by the NAND gates A2, A3 and the inverter gate A5 whose input is coupled to the common output of the gates A2, A3. The inputs of the NAND gates A2, A3 are also commonly tied together and further joined to the input circuit terminal X11. The output of the inverter gate A5 is connected to the junction of the collector of the Schottky transistor Q9 and the output circuit terminal Y11. It should be understood by those skilled in the art that the clock driver circuit of the present invention may be formed as an integrated circuit on a single semiconductor chip.

Figure 3:
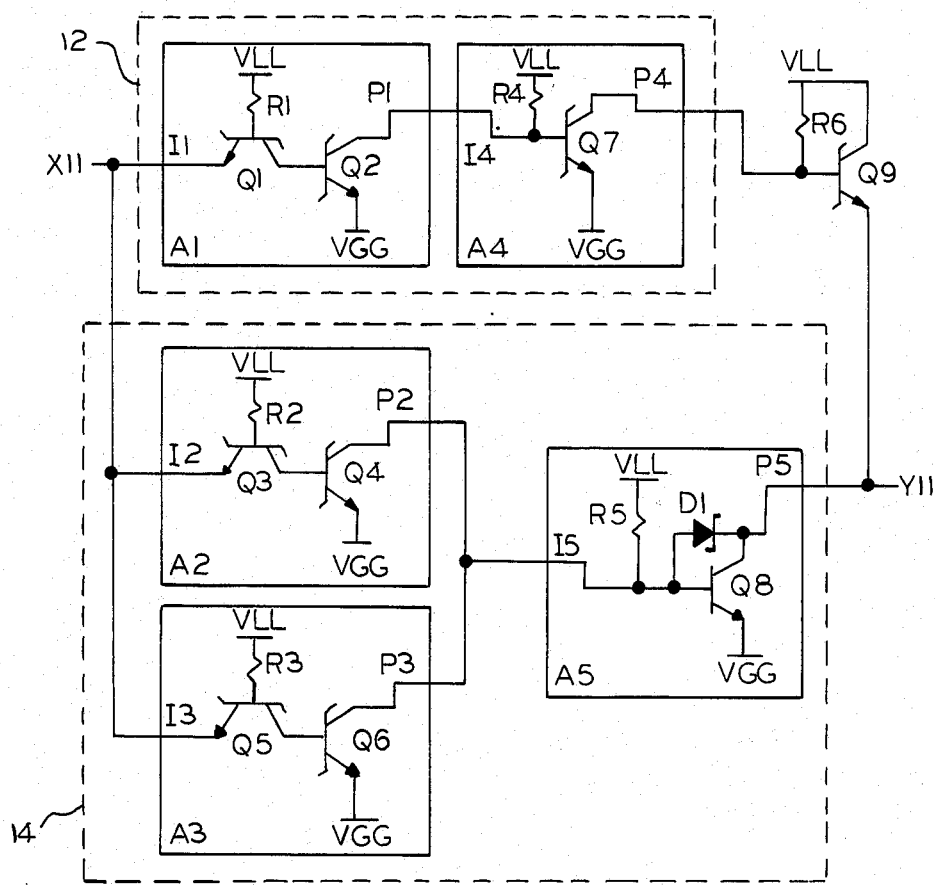
FIG. 3 is a detailed circuit diagram of the clock driver circuit shown in FIG. 2.

A schematic circuit diagram illustrating the details of the NAND gates A1, A2, A3 and the inverter gates A4, A5 of FIG. 2 is shown in FIG. 3 of the drawings. The NAND gate A1 has an input node I1 and an output node P1. The gate A1 includes a first Schottky transistor Q1, a second Schottky transistor Q2 and a first bias resistor R1. The base of the transistor Q1 is connected to one end of the first resistor R1, and the other end of the resistor R1 is tied to a voltage supply potential VLL. The emitter of the tramsistor Q1 is joined to the input node I1, and the collector of the transistor Q1 is coupled to the base of the second transistor Q2. The collector of the transistor Q2 is tied to the output node P1, and the emitter of the transistor Q2 is connected to a ground potential VGG.

Similarly, the NAND gate A2 has an input node I2 and an output node P2. The gate A2 includes a third Schottky transistor Q3, a fourth Schottky transistor Q4, and a second bias resistor R2. The base of the third transistor Q3 is connected to one end of the second resistor R2, and the other end of the resistor R2 is tied to the voltage supply potential VLL. The emitter of the third transistor Q3 is joined to the input node I2, and the collector of the transistor Q3 is coupled to the base of the fourth transistor Q4. The collector of the transistor Q4 is tied to the output node P2, and the emitter of the transistor Q4 is connected to the ground potential VGG.

Further, the NAND gate A3 has an input node I3 and an output node P3. The gate A3 is formed of a fifth Schottky transistor Q5, a sixth Schottky transistor Q6 and a third bias resistor R3. The base of the fifth transistor Q5 is connected to one end of the third bias resistor R3, and the other end of the resistor R3 is tied to the voltage supply potential VLL. The emitter of the transistor Q5 is joined to the input terminal I3, and the collector of the transistor Q5 is coupled to the base of the sixth transistor Q6. The collector of the transistor Q6 is tied to the output node P3, and the emitter of the transistor Q6 is connected to the ground potential VGG. The input nodes I1, I2 and I3 of the respective gates A1, A2 and A3 are commonly connected together and are further connected to the input circuit terminal X11. The output nodes P2 and P3 of the respective gates A2 and A3 are commonly connected together.

The inverter gate A4 has an input node I4 and an output node P4. The input node I4 of the inverter gate A4 is connected to the output node P1 of the NAND gate A1, and the output node P4 is connected to the junction of the base of the output transistor Q9 and the load resistor R6. The inverter gate A4 consists of a seventh Schottky transistor Q7 and a fourth bias resistor R4. The base of the transistor Q7 is coupled to one end of the fourth resistor R4 and the input node I4, and the other end of the resistor R4 is connected to the voltage supply potential VLL. The collector of the transistor Q7 is connected to the output node P4, and the emitter of the transistor Q7 is tied to the ground potential VGG.

The inverter gate A5 has an input node I5 and an output node P5. The input node I5 of the inverter gate A5 is connected to the common output nodes P2, P3 of the respective NAND gates A2 and A3. The output node P5 is connected to the emitter of the output transistor Q9 and to the output circuit terminal Y11. The inverter gate A5 consists of an eigth transistor Q8 which is a bipolar npn transistor, a Schottky barrier-diode D1 and a fifth bias resistor R5. The base of the transistor Q8 is connected to the input node I5, one end of the fifth resistor R5 and the anode of the diode D1. The other end of the resistor R5 is connected to the voltage supply potential VLL. The collector of the transistor Q8 is tied to the cathode of the diode D1 and to the output node P5. The emitter of the transistor Q8 is coupled to the ground potential VGG. The Schottky barrier-diode D1 interconnected between the base and collector of the transistor Q8 has a forward voltage drop which is lower than the collector-base junction of the transistor Q8 thereby preventing saturation and thus increasing of switching speed.

In operation, when the input voltage level is low at the input circuit terminal X11 and consequently at the input nodes I1, I2 and I3 all of the transistors Q1, Q3 and Q5 are in the conductive or turned on state. As a result, these transistors Q1, Q3 and Q5 will in turn render the respective transistors Q2, Q4 and Q6 non-conductive or turned off by pulling out the base drive current thereto. Since the output node P1 is tied to the voltage supply potential VLL via the bias resistor R4 and the output nodes P2, P3 are tied to the same voltage supply potential VLL via the bias resistor R5, the input nodes I4, I5 will become high and clamped to the forward drop of the voltage across the base and emitter junction of the respective transistors Q7 and Q8. With the transistor Q8 and Q7 turned on, the transistor Q9 is turned off thereby generating a low level state at the output circuit terminal Y11.

When the input voltage level is high at the input circuit terminal X11 and thus also appearing at the input nodes I1, I2 and I3, all of the transistors Q1, Q3 and Q5 will be rendered non-conductive or turned off thrby causing the transistors Q2, Q4 and Q6 to be also turned on. This is in turn sufficient to cause the turning off of the transistor Q7 and Q8.

With the transistor Q7 being turned off, the transistor Q9 will keep adequate base current through the bias resistor R6. Consequently, the transistor Q9 will be rendered conductive or turned on to generate a high level voltage at the output circuit terminal Y11

As was previously pointed out, the clock driver circuit described is capable of driving 40 units of low level gates. Other embodiments of clock driver circuit arrangements with higher fanout capabilities are illustrated in FIGS. 4, 5 and 6.

The clock driver circuit in the second embodiment of FIG. 4 is capable of driving 80 units of low level gates. The clock driver circuit of the third embodiment of FIG. 5 is capable of driving 120 units of low level gates. The clock driver circuit of the third embodiment of FIG. 6 is capable of driving 160 units of low level gates.

The clock driver circuit 16 of FIG. 4 is identical to the clock driver circuit of FIG. 2 except for the addition of a thrid circuit portion 18. The third circuit portion 18 is formed of NAND gates A6, A7 and inverter gate A8. The third circuit portion 18 is identical to the second circuit portion 14 of FIG. 2 and is connected between the input circuit terminal X11 and the output circuit terminal Y11 so as to accommodate the increased fanout requirements.

Figures 5, 6:
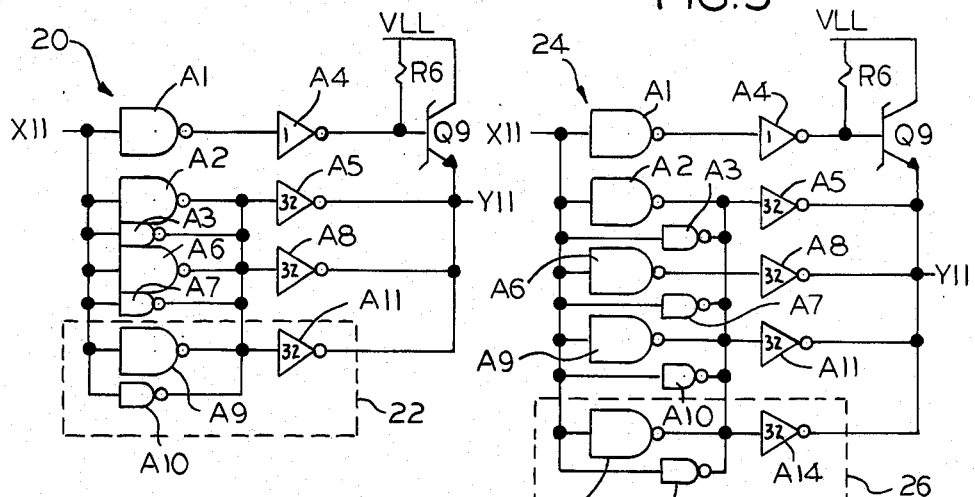

The clock driver circuit 20 of FIG. 5 is identical to the clock driver circuit of FIG. 4 except for the further addition of a fourth circuit portion 22. The fourth circuit portion 22 is formed of NAND gates A9, A10 and inverter gate A11. This fourth circuit portion 22 is identical to the second portion 14 of FIG. 2 and is also connected between the input circuit terminal X11 and the output circuit terminal Y11.

The clock driver circuit 24 of FIG. 6 is identical to the clock driver circuit of FIG. 5 except for the further addition of a fifth circuit portion 26. The fifth circuit portion 26 is formed of NAND gates A12, A13 and inverter gates A14. This fifth circuit portion 26 is identical to the second circuit portion 14 of FIG. 2 and is likewise interconnected between the input circuit terminal X11 and the output circuit terminal Y11.

The clock driver circuit of the present invention has the following advantages over the prior art as follows:
(1) it requires a reduced number of gates and consumes less electrical power;
(2) it utilizes a lower supply voltage potential which is compatible with low level gates;
(3) it is more compact and requires less space area:
(4) it has no clock skew:
(5) it is capable of driving capacitive loads due to its active pull up; and
(6) it has relatively high speed which is insensitive to the circuit configuration and its load.

From the foregoing detailed description, it can thus be seen that the present invention provides an improved clock driver circuit for low level gate which has high fanout capabilities and consumes less electrical power. The clock driver circuit of the present invention uses a lower voltage supply potential which is compatible with low level gates and exhibit a relatively simplified circuit construction due to a reduced number of gates required.

While there has been illustrated and described what is at present considered to be preferred embodiments of the present invention, it will be understood by those skilled in the art that various changes and modifications may be made, and equivalents may be substituted for elements thereof, without departing from the true scope of the invention. In addition, many modifications may be made to adapt a particular situation or material to the teachings of the invention without departing from the central scope thereof. Therefore, it is intended that this invention not be limited to the particular embodiments disclosed as the best modes contemplated for carrying out this invention, but that the invention will include all embodiments falling within the scope of the appended claims.

What is claimed is:

1. A clock driver circuit for low level gates which provides high fanout capabilities, said driver circuit comprising:
   a first circuit portion formed of a first NAND logic gate and a first inverter gate, the input node of said first inverter gate being coupled to the output node of said first NAND gate, the input of said first NAND gate being connected to an input circuit terminal;
   a second circuit portion formed of a second NAND logic gate, a third NAND logic gate and a second inverter gate, the input nodes of said second and third NAND gates being coupled together and to the input circuit terminal, the output nodes of said second and third NAND gates being coupled together and to the input node of said second inverter gate, the output node of said second inverter gate being connected to an output circuit terminal;
   an output transistor having its base coupled to the output node of said first inverter gate, its collector coupled to a voltage supply potential and its emitter coupled to the output circuit terminal; and
   a load resistor having one end connected to the base of said output transistor and its other end connected to the voltage supply potential.

2. A clock driver circuit as claimed in claim 1, wherein said first NAND gate comprises a first Schottky transistor, a second Schottky transistor and a first bias resistor.

3. A clock driver circuit as claimed in claim 2, wherein said first Schottky transistor has its base connected to one end of the first bias resistor, its collector connected to the base of said second Schottky transistor and its emitter connected to the input node of said first NAND gate, the other end of the first bias resistor being connected to the voltage supply potential, and wherein said second Schottky transistor has its collector connected to the output node of said first NAND gate and its emitter connected to a ground potential.

4. A clock driver circuit as claimed in claim 2, wherein said second NAND gate comprises a third Schottky transistor, a fourth Schottky transistor, and a second bias resistor.

5. A clock driver circuit as claimed in claim 4, wherein said third Schottky transistor has its base connected to one end of the second bias resistor, its collector connected to the base of said fourth Schottky transistor and its emitter connected to the input node of said second NAND gate, the other end of the second bias transistor being connected to the voltage supply potential, and wherein said fourth Schottky transistor has its collector connected to the output node of said second NAND gate and its emitter connected to a ground potential.

6. A clock driver circuit as claimed in claim 4, wherein said third NAND gate comprises a fifth Schottky transistor, a sixth Schottky transistor and a third bias resistor.

7. A clock driver circuit as claimed in claim 6, wherein said fifth Schottky transistor has its base connected to one end of the third bias resistor, its collector connected to the base of sadi sixth Schottky transistor and its emitter connected to the input node of said third NAND gate, the other end of the third bias resistor being connected to the voltage supply potential, and wherein said sixth Schottky transistor has its collector connected to the output node of said third NAND gate and its emitter connected to a ground potential.

8. A clock driver circuit as claimed in claim 1, wherein said first inverter gate comprises a Schottky transistor and a bias resistor, said Schottky transistor having its base connected to one end of the bias resistor and to the input node of said first inverter gate, its collector connected to the output node of said first inverter gate and its emitter connected to a ground potential, the other end of the bias resistor being connected to the voltage supply potential.

9. A clock driver circuit as claimed in claim 1, wherein said second inverter gate comprises a bipolar npn transistor and a bias resistor, said bipolar transistor having its base connected to one end of the bias resistor and to the input node of said second inverter gate, its collector connected to the output node of said second inverter gate, and its emitter gate connected to a ground potential, the other end of the bias resistor being connected to the voltage supply potential.

10. A clock driver circuit as claimed in claim 9, further comprising a Schottky diode having its anode connected to the base of said bipolar transistor and its cathode connected to the collector of said bipolar transistor.

11. A clock driver circuit for low level gates which provides high fanout capabilities, said driver circuit comprising:
a first circuit portion formed of a first NAND logic gate and a first inverter gate, the input node of said first inverter gate being coupled to the output node of said first NAND gate, the input node of said first NAND gate being connected to an input circuit terminal;
a second circuit portion formed of a second NAND logic gate, a third NAND logic gate and a second inverter gate, the input nodes of said second and third NAND gates being coupled together and to the input circuit terminal, the output nodes of said second and third NAND gates being coupled together and to the input node of said second inverter gate, the output node of said second inverter gate being connected to an output circuit terminal;
a third circuit portion formed of a fourth NAND logic gate, a fifth NAND logic gate and a third inverter gate, the input nodes of said fourth and fifth NAND gates being coupled together and to the input circuit terminal, the output nodes of said fourth and fifth NAND gates being coupled together and to the input node of said third inverter gate, the output node of said third inverter gate being connected to the output circuit terminal;
an output transistor having its base coupled to the output node of said first inverter gate, its collector connected to a voltage supply potential and its emitter coupled to the output circuit terminal; and
a load resistor having its one end connected to the base of said output transistor and its other end connected to the voltage supply potential.

12. A clock driver circuit as claimed in claim 11, further comprising a fourth circuit portion formed of a sixth NAND logic gate, a seventh NAND logic gate and a fourth inverter gate.

13. A clock driver circuit as claimed in claim 12, further comprising a fifth circuit portion formed of an eighth NAND logic gate, a ninth NAND logic gate and a fifth inverter gate.

14. A clock driver circuit as claimed in claim 13, wherein each of said second through said ninth NAND gates comprises a pair of Schottky transistor and a bias resistor.

15. A clock driver circuit as claimed in claim 13, wherein each of said second through said fifth inverter gates comprises a bipolar npn transistor and a bias resistor.

16. A clock driver circuit for low level gates which provides high fanout capabilities, said driver circuit comprising:
a first circuit portion formed of a first NAND logic gate and a first inverter gate, the input node of said inverter gate being coupled to the output node of said first NAND gate, the input node of said first NAND gate being connected to an input circuit terminal;
a plurality of second circuit portions each being formed of a second NAND logic gate, a third NAND logic gate and a second inverter gate, the input nodes of said second and third NAND gates being coupled together and to the input circuit terminal, the output nodes of said second and third NAND gates being coupled together and to the input node of said second inverter gate, the output node of said second inverter gate being connected to an output circuit terminal;
an output transistor having its base coupled to the output node of said first inverter gate, its collector coupled to a voltage supply potential and its emitter coupled to the output circuit terminal; and
a load resistor having its one end connected to the base of said output transistor and its other end connected to the voltage supply potential.

17. A clock driver circuit as claimed in claim 16, wherein each of said second and third NAND logic gates comprise a pair of Schottky transistors and a bias resistor.

18. A clock driver circuit as claimed in claim 16, wherein each of said second inverter gates comprise a bipolar npn transistor and a bias resistor.

19. A clock driver circuit as claimed in claim 1, wherein said driver circuit is formed as an integrated circuit on a single semiconductor chip.

20. A clock driver circuit as claimed in claim 17, wherein said clock driver circuit is formed as an integrated circuit on a single semiconductor chip.

* * * * *